(12) United States Patent
Kung

(10) Patent No.: US 6,253,356 B1
(45) Date of Patent: *Jun. 26, 2001

(54) SYSTEM AND METHOD FOR IMPROVING LOGIC SYNTHESIS IN LOGIC CIRCUITS

(75) Inventor: David S. Kung, Chappaqua, NY (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/046,831

(22) Filed: Mar. 24, 1998

(51) Int. Cl.$^7$ ...................................................... G06F 17/50
(52) U.S. Cl. ...................................................... 716/5; 716/6
(58) Field of Search .......................... 395/500.06, 500.07; 716/5, 6, 2

(56) References Cited

U.S. PATENT DOCUMENTS

| | | | | |
|---|---|---|---|---|
| 5,396,435 | * | 3/1995 | Ginetti ..................................... | 716/6 |
| 5,402,356 | * | 3/1995 | Schaefer et al. .......................... | 716/1 |
| 5,648,911 | * | 7/1997 | Grodstein et al. ...................... | 716/18 |
| 5,654,898 | * | 8/1997 | Roetcisoender et al. ................ | 716/9 |
| 5,799,170 | * | 8/1998 | Drumm et al. .......................... | 716/2 |
| 6,006,023 | * | 12/1999 | Higashida ................................ | 716/6 |

OTHER PUBLICATIONS

Kung et al "A Fast Fanout Optimization Algorithm for Near–Continuous Buffer Libraries," IEEE, pp. 352–355, Jun. 1998.*

Navarro et al "CMOS Tapered Buffer Design for Small Width Clock/Data Signal Propagation," IEEE, pp. 89–94, Feb. 1998.*

Carragher et al "Simple Tree–Construction Heuristics for the Fanout Problem," IEEE, pp. 671–679, 1995.*

Kanwar Jit Singh et al., "A Heuristic Algorithm for the Fanout Problem", 27th ACM/IEEE Design Automation Conference, University of California, Berkeley, Paper 21.5, pp. 357–360, Jun. 1990.

Kang, M., Dai, W.W.,–M., Dillinger, T., and LaPotin, D., "Delay Bounded Buffered Tree Construction for Timing Driven Floorplanning", IEEE/ACM International Conference on Computer–Aided Design, Nov. 13, 1997, pp. 707–712.*

Alpert, C., and Devgan, A., "Wire Segmenting for Improved Buffer Insertion", Proceedings of the 34th Design Automation Conference, Jun. 13, 1997, pp. 588–593.*

Brand, D., Damiano, R.F., van Ginneken, L.P.P.P., and Drumm, A.D., "In the Driver's Seat of BooleDozer", Proceedings of IEEE International Conference on Computer Design: VLSI in Computers and Processors, Oct. 12, 1994, pp. 518–521.*

(List continued on next page.)

*Primary Examiner*—Matthew Smith
*Assistant Examiner*—Vuthe Siek
(74) *Attorney, Agent, or Firm*—F. Chau & Associates, LLP

(57) ABSTRACT

A method of fanout optimization includes the steps of inputting a net list including fanout regions, each fanout region having sources, each source being coupled to at least one sink, determining a gain for inverters to be placed in a buffer tree, wherein the gain has a same value for all inverters to be placed within the tree, computing a number of inverters used to couple the source to each sink and introducing inverters into the buffer tree to couple the source to each sink. A system for employing the method of fanout optimization is also described.

23 Claims, 6 Drawing Sheets

OTHER PUBLICATIONS

Kodandapani, K., Grodstein, J., Domic, A., and Touati, H., "A Simple Algorithm for Fanout Optimization Using High–Performance Buffer Libraries", IEEE/ACM International Conference on Computer–Aided Design, Nov. 11, 1993, pp. 466–471.*

Ginetti, A., and Brasen, D., "Modifying the Netlist after Placement for Performance Improvement", Proceedings of the IEEE Custom Integrated Circuits Conference, May 12, 1993, pp. 9.2.1–9.2.4.*

Brasen, D., Schaefer, T., Ginetti, A., and Chu, S., "Post–Placement Buffer Reoptimization", Proceedings of Euro ASIC, Jun. 5, 1992, pp. 156–161.*

Aoki, T., Murakata, M., Mitsuhashi, T., and Goto, N., "Fanout–tree Restructuring Algorithm for Post–placement Timing Optimization", Proceedings of the Asian and South Pacific Design Automation Conference, Sep. 1, 1995, pp. 417–422.*

Shen Lin, Marek–Sadowska, M., "A Fast and Efficient Algorithm for Determining Fanout Trees in Large Networks", Proceedings of the European Conference on Design Automation, Feb. 25, 1991, pp. 539–544.*

Dhar, S., and Franklin, M.A., "Optimum Buffer Circuits for Driving Long Uniform Lines", IEEE Journal of Solid–State Circuits, vol. 26, No. 1, Jan. 1991, pp. 32–40.*

Shepard, K.L., Carey, S.M., Cho, E.K., Curran, B.W., Hatch, R.F., Hoffman, D.E., McCabe, S.A., Northrop, G.A., and Seigler, R., "Design methodology for the S/390 Parallel Enterprise Server G4 microprocessors", IBM Journal of Research and Development, vol. 41, No. 4/5, Jul. 30, 1997.*

* cited by examiner

SYSTEM AND METHOD FOR IMPROVING LOGIC SYNTHESIS IN LOGIC CIRCUITS

BACKGROUND OF THE INVENTION

1. Field of the Invention

The present invention relates to logic circuits and, more particularly, to a method and apparatus for improving logic synthesis by fanout optimization.

2. Description of the Related Art

Logic circuits designs attempt to reduce a number of timing and capacitance violations. Fanout optimization is one method of achieving this reduction. Fanout optimization is the construction of a buffer tree to drive large capacitive loads so that timing and capacitance violations are reduced as much as possible. Fanout optimization is important in improving the performance of a logic circuit during logic synthesis but is one of the most time consuming synthesis transforms.

A proposed method of addressing the fanout problem is addressed in an article by K. J. Singh et al., "A Heuristic Algorithm for the Fanout Problem", pp. 357–360, Proc. of the 27th Design Automation Conference, 1990. The method described in this article relies on heuristics which assume some template topology for the buffer tree and then use some intelligent combinational search to select a buffer size for each tree node and a sink arrangement. These types of methods are polynomial in the number of sinks, the number of stages in the buffer tree and the number of buffers available in the library. As a result the runtime can be prohibitive when the number of sinks and the number of available buffers are large. The conventional approach typically builds a fanout tree based on the sizes and loads of buffers.

Therefore, a need exists for a fanout optimization method and apparatus for increasing the speed of logic synthesis. A further need exists for obtaining buffer sizes and a topology of a buffer tree while avoiding a combinational search by using an underlying delay model of the buffers. Yet another need exists for a method of reasoning with gain to build a fanout tree.

SUMMARY OF THE INVENTION

A method of fanout optimization includes the steps of inputting a net list including fanout regions, each fanout region having sources, each source being coupled to at least one sink, determining a gain for inverters to be placed in a buffer tree, wherein the gain has a same value for all inverters to be placed within the tree, computing a number of inverters used to couple the source to each sink and introducing inverters into the buffer tree to couple the source to each sink.

In alternate methods, the step of selecting inverters for the buffer tree from a library may also be included. A cost function may be used to select the gain based on layout area. The gain may be selected by the step of varying a value of the gain within a gain window until layout area is at a lowest value. The step of apportioning a delay on a path between inverters by assigning a level value for each path for representing the number of the inverters between each sink and the source of each path may be included. The step of apportioning the delay may further include assigning the level by taking a ratio between a delay on the path between a source and a sink a delay of an inverter, and truncating a result by removing a fractional portion. The step of modifying the level for each path based on a polarity of the sink may also be included. The step of constructing the buffer tree by sizing the inverters based on a load calculated between the source and the sink for each path and dividing by the gain may be included. The step of combining inverters on a path by introducing a larger inverter to replace multiple smaller inverters on the path may also be included.

A method for reducing timing and capacitance violations in logic circuits includes the steps of identifying problematic fanout regions of a circuit, the fanout regions having a source coupled by a path to at least one sink, determining a gain based on a cost function for inverters to be introduced into the circuits between on each path, constructing a buffer tree for each fanout region by calculating a number of inverters on the path between the source and each sink in accordance with load and timing constraints and placing the inverters in the buffer tree starting from each sink and moving toward the source.

In alternate methods, the step of selecting inverters for the buffer tree from a library may be included. The cost function may select the gain based on layout area. The gain may be selected by the step of varying a value of the gain within a gain window until layout area is at a lowest value. The step of apportioning a delay on a path between inverters by assigning a level value for each path for representing the number of the inverters between each sink and the source of each path may be included. The step of apportioning the delay may further include assigning the level by taking a ratio between a delay on the path between a source and a sink a delay of an inverter, and truncating a result by removing a fractional portion. The step of modifying the level for each path based on a polarity of the sink may be included. The step of constructing the buffer tree may include the step of sizing the inverters based on a load calculated between the source and the sink for each path and dividing by the gain. The step of combining inverters on a path by introducing a larger inverter to replace multiple smaller inverters on the path may also be included.

A system for reducing load and timing violations in logic circuits includes means for inputting a net list including fanout regions, each fanout region having sources, each source being coupled to at least one sink, means for determining a gain for inverters to be placed in a buffer tree, wherein the gain has a same value for all inverters to be placed within the tree and is determined based on a cost function, means for computing a number of inverters used to couple the source to each sink and means for introducing inverters into the buffer tree to couple the source to each sink.

In alternate embodiments, the system may include inverters for the buffer tree selected from a library. The inverters may be single stage inverters.

These and other objects, features and advantages of the present invention will become apparent from the following detailed description of illustrative embodiments thereof, which is to be read in connection with the accompanying drawings.

BRIEF DESCRIPTION OF DRAWINGS

The invention will be described in detail in the following description of preferred embodiments with reference to the following figures wherein.

DETAILED DESCRIPTION OF PREFERRED EMBODIMENTS

Figure 1:
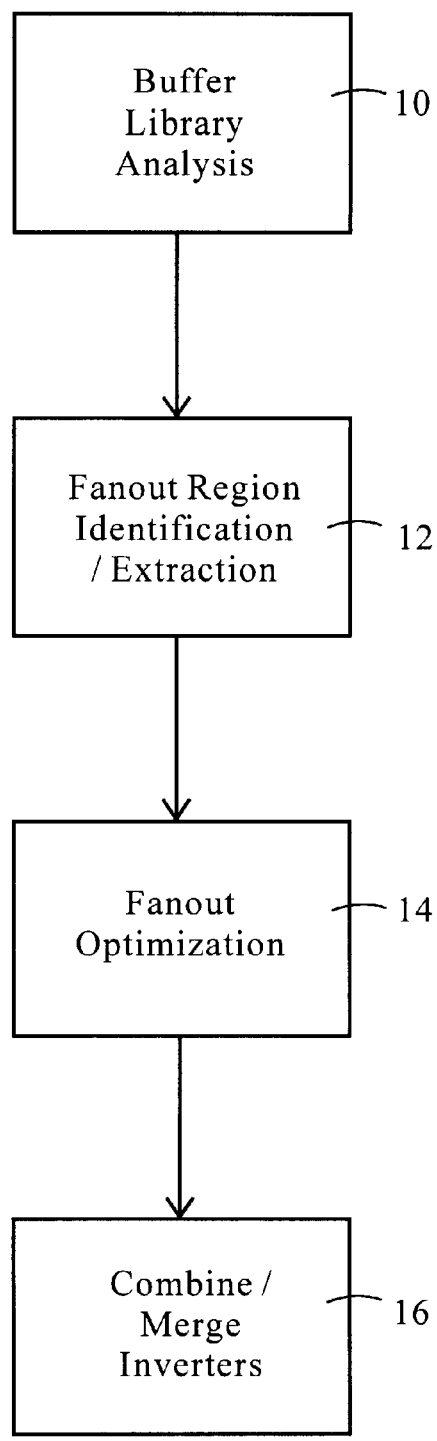
FIG. 1 is a block/flow diagram of a fanout optimization method in accordance with the present invention.

The present invention relates to logic circuits and, more particularly, to a method and apparatus for improving logic synthesis by fanout optimization. The method described in this invention uses the physics of an underlying delay model of buffers in a circuit, preferably a logic circuit, to obtain a topology of a buffer tree and the sizes of buffers, thereby avoiding a lengthy combinational search associated with conventional techniques. One important aspect of the method is the use of a gain, which is the ratio of an output load of a buffer to its input pin capacitance. Instead of reasoning directly with size and load of buffers to build a fanout tree, the method is based on reasoning with gain. The present invention extracts a fanout problem for each problematic fanout region in a circuit, followed by a method for constructing a buffer tree at each fanout region so that timing and capacitance violations are substantially reduced.

Referring now in specific detail to the drawings in which like reference numerals identify similar or identical elements throughout the several views, it should be understood that the elements shown in the FIGS. may be implemented in various forms of hardware, software or combinations thereof. Preferably, these elements are implemented in software on one or more appropriately functioning processors which may include programmed general purpose processors, memory and input/output interfaces.

Figure 2:
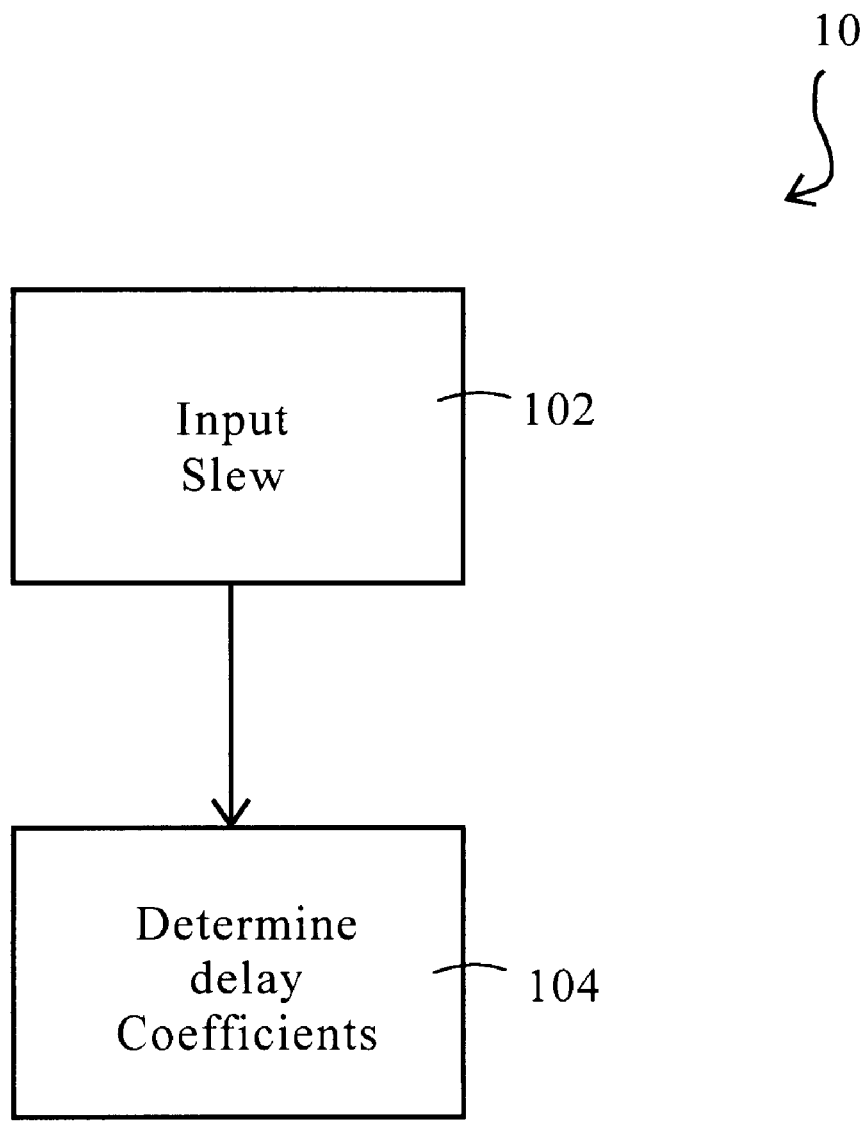
FIG. 2 is a block/flow diagram of a buffer library analysis in accordance with the present invention.

Referring to FIGS. 1 and 2, block/flow diagrams are shown for fanout optimization in accordance with the present invention. In block 10, a buffer or inverter library analysis is implemented. A buffer library includes non-inverting buffers and inverters. A buffer library analysis is performed by focusing on inverters which are single stage designs at the transistor level in circuits. These inverters are referred to as simple inverters. In block 102, delay versus gain data is collected for simple inverters of different sizes by inputting a nominal slew, for example 0.1 nanoseconds. The data collected for the simple inverters are least-squares fitted utilizing the following delay equation:

$$\text{delay} = p + l \cdot g \qquad (1)$$

where p and l are coefficients for the least squares fit and g is the gain defined as $$g = \text{load } C_{in} \qquad (2)$$

with $C_{in}$ being the input pin capacitance of the inverter and load being the load of the inverter. The least squares may be performed for both the rise-fall and fall-rise transitions of the inverters. In block 104, the coefficients p and l are determined and may be written as $p_{rf}$, $p_{fr}$, $l_{rf}$ and $l_{fr}$ to designate the rise-fall and fall-rise components. Given a gain assignment, the rise-fall and fall-rise delay of an inverter are well approximated by these coefficients. In other embodiments it may be useful to use other data/curve fitting techniques to approximate circuit delays versus gain curves. For illustrative purposes, coefficients p and l are deemed to include rise-fall and fall-rise coefficients hereinafter.

The buffer library analysis identifies inverters appropriate for use in a buffer tree as outlined in greater detail below. The buffer tree will use inverters having the same gain. In a preferred embodiment of the invention, inverters are selected from the buffer library, however, inverters may be selected as appropriate by a circuit designer.

Figure 3:
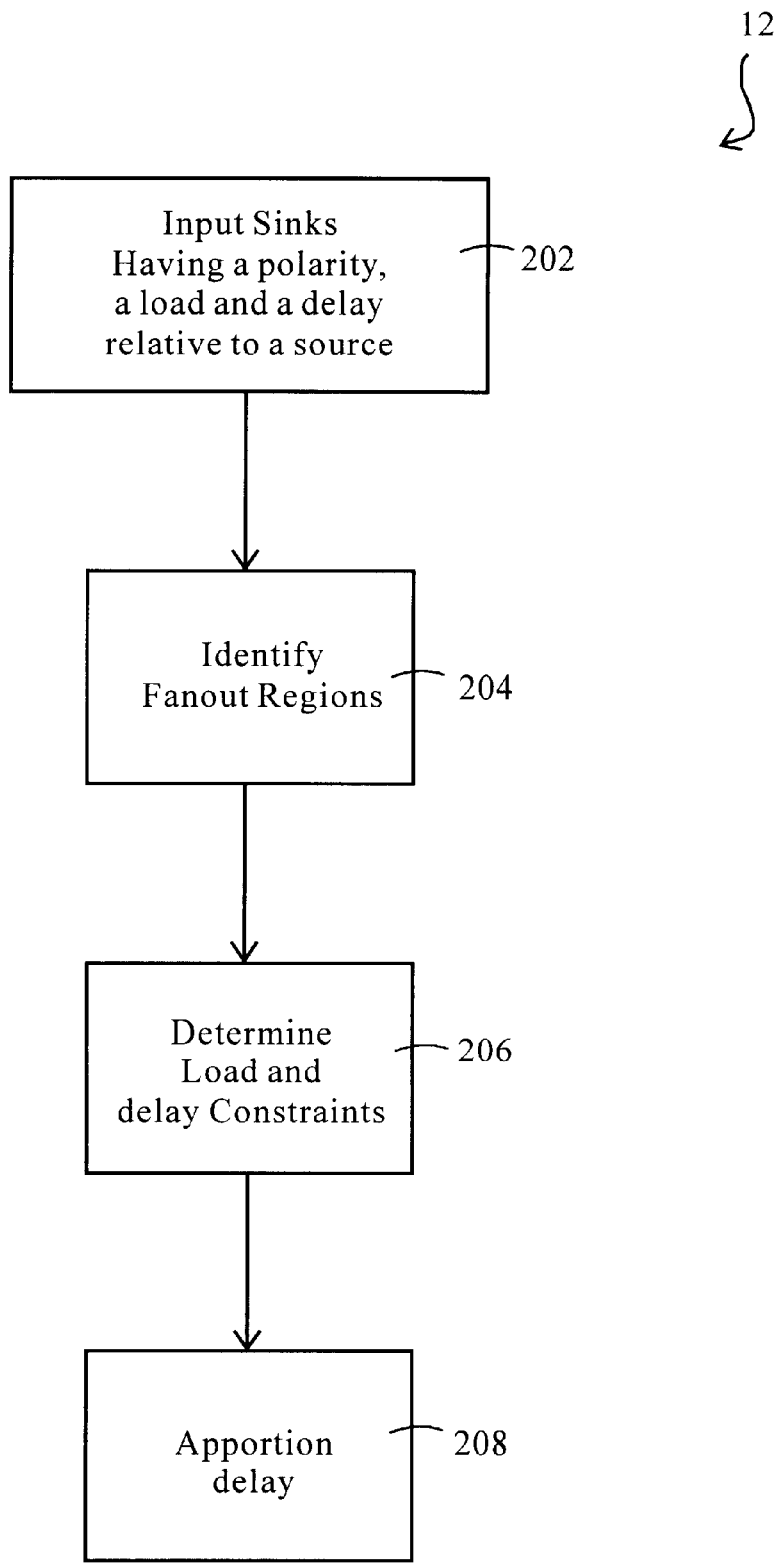
FIG. 3 is a block/flow diagram of a fanout region identification/extraction method in accordance with the present invention.

Referring to FIGS. 1 and 3, in a block 12, fanout regions are identified and extracted from the circuit or net list. A fanout problem is defined as a circuit having timing and or capacitance violations above a predetermined threshold. Timing and capacitance violations are defined for an individual circuit. For the circuit to operate according to specifications/requirements, the timing and capacitance between a source and its sinks must be controlled within acceptable limits. The fanout problem exists in a portion of a circuit which includes violations of timing and capacitance specifications which are undesirable within the circuit.

In block 202, inputs to the fanout problem are as follows. A fanout region includes a source and a set of sinks. The sinks include positive polarity sinks, P, and negative polarity sinks, Q. Each sink, $s_i$, has a given polarity and drives a load $L_i$. A capacitance constraint is imposed at the source, for example, the load the source can drive is less than or equal to C, where C is a predetermined value for capacitance. A timing constraint is imposed on each sink so that the delay from the source to the sink, $s_i$, is less than or equal to $D_i$.

To comply with the constraints described above, a buffer tree is constructed such that the load L presented to the source is less than or equal to C, and that the timing constraint at each sink is observed (is less than or equal to $D_i$). In a block 204, to extract all the fanout problems from the circuit, the most problematic fanout regions are identified and then the capacitance and timing constraints are derived in block 206. The fanout regions of a circuit may be defined as follows. Each primary input pin of the circuit and each output pin of every gate is defined as the source of a fanout region. At each source, the fanout region is identified by performing a depth first search from the source and terminating at primary output pins and input pins of gates which are neither non-inverting buffers nor inverters. Terminal pins with respect to the depth first search are the sinks of the fanout region. The polarity of a sink is equal to the parity of the number of inverters on the path between the source and the sink. A problematic fanout region is one in which there exists a net whose load exceeds a maximum load limit of its source gate. Problematic fanout regions and fanout regions are used interchangeably hereinafter.

The capacitance constraint of the fanout problem may be obtained as follows. If the source is a primary input pin, the capacitance constraint at the source is the primary input capacitance limit set by the designer. If the source is an output pin of a gate in the circuit, the capacitance constraint is the preferred load for that gate.

The delay constraints of the fanout problem may be obtained. Each fanout region is removed and substituted by a canonical fanout network, which is constructed as follows. Sinks with even polarity are connected to the source by a path with a non-inverting buffer while sinks with odd polarity are connected to the source by a path with an inverter. The timing system may provide a parameter, S, to scale the delay of the gates.

The delay is apportioned to each fanout region as follows:
1. Set S=0 for the gates in the canonical fanout subnetworks and S=1 for the remainder of the gates in the circuit.
2. Let F be the set of the sinks of all the fanout regions. Find a sink in F with a largest slack (slack is the difference between an actual time of arrival at an input or source and a required arrival time at an output or sink) and denote it by f. If the slack of f is less than 0, go to step 4, otherwise go to step 3.
3. Let b be the source gate of f and σ be a predefined scale increment. Increase the S of b by σ. Go to step 2.
4. Process the fanout regions in the circuit. Given a fanout region, the delay constraint $D_i$, for sink i is the arrival time of sink i minus the arrival time of the source. If $D_i$ is less than 0 then set $D_i$ to 0.

Figure 4:
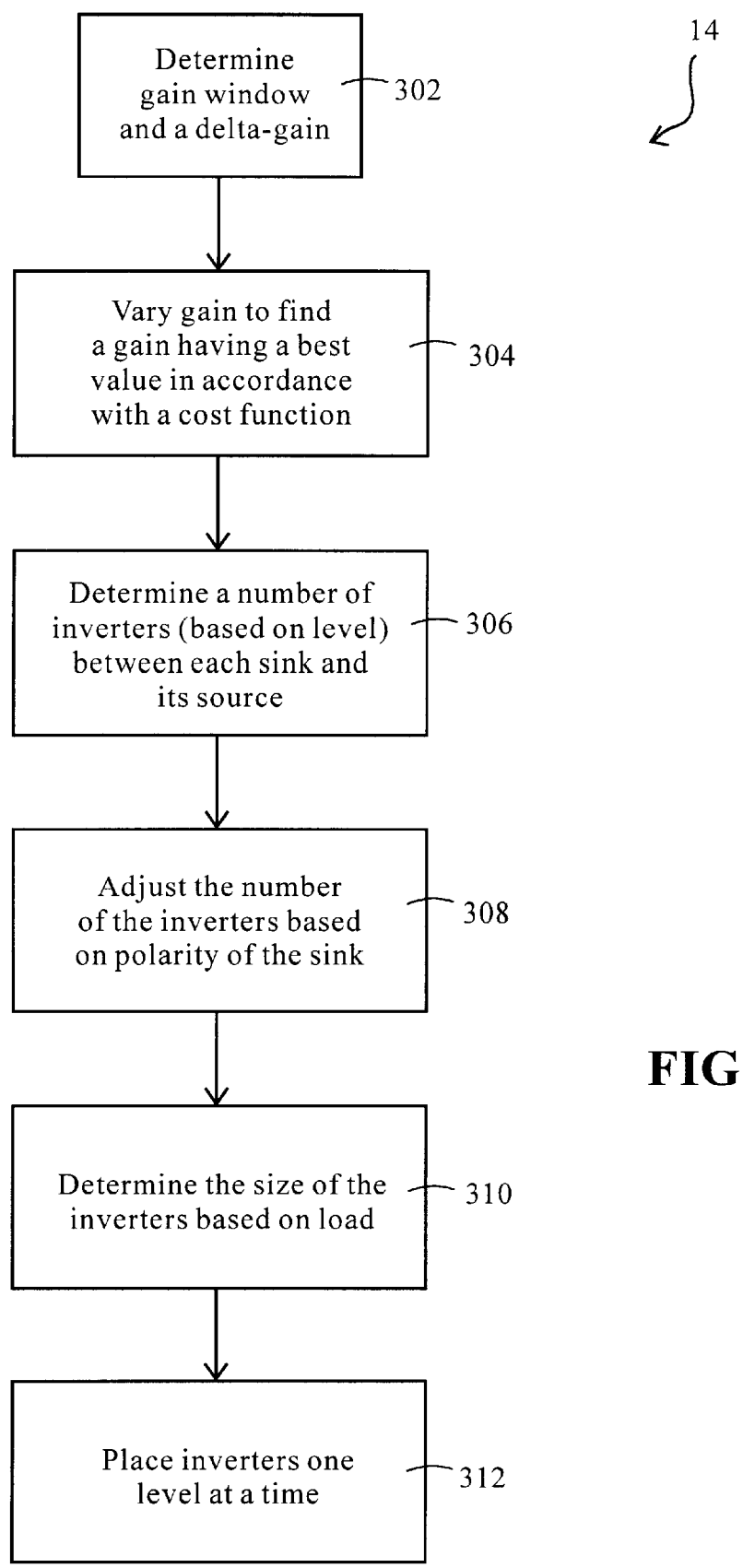
FIG. 4 is a block/flow diagram showing more detail of the fanout optimization method in accordance with the present invention.

Referring to FIGS. 1 and 4, in block 14, a fanout optimization is performed. A gain is selected which is used for all inverters in the buffer tree. In a preferred method, the gain is selected by choosing a gain window in block 302 between an upper limit and a lower limit. A cost function is used to determine which gain within the gain window provides a best result in block 304. For example, the cost function may be used to determine an area of a buffer tree associated with a first gain, then the cost function is calculated for a second gain to determine an associated area. The gain resulting in the lowest area would be chosen as the gain for the inverters of the buffer tree. The gain can be iteratively incremented and tested against the cost function to provide a discrete result. Other cost functions are contemplated depending on the circuit requirements.

One important aspect of the invention is to restrict the solution of the fanout optimization problem to buffer trees in which all the inverters have the same gain. The delay of an inverter is determined by its gain regardless of the load according to the relation:

$$\text{delay} = p + l \cdot g \qquad (1)$$

Given a gain as calculated in block 304, the delay constraint at each sink determines the number of inverters on the path from the source to that sink. The size of each inverter in the buffer tree is determined once the gain is chosen. A gain is chosen by varying the gain within a desired gain window to determine the best performance of the inverters in the buffer tree as described above for block 304. In a preferred method, the cost function is based on area of the circuit and buffer tree, i.e. a preferred buffer tree occupies less area.

A buffer tree is constructed by apportioning delay along paths between the sinks and their source as described above in block 208. In one method, the delay is apportioned by determining the delay along the path and dividing it by the delay calculated for the inverters in accordance with Equation (1). This yields a result that is truncated to remove the decimal portion of the ratio, and leaves an integer value. The integer value denotes an inverter level. In block 306 the number of inverters is determined for each path between each sink and its source. An inverter level is a number of inverters that are to be placed on the path between each sink an its source. For example, inverter level 4 means four inverters are to be placed between a source and a sink to achieve load and timing constraints. Since inverters affect parity, the number of inverters in a path may be modified to produce a polarity at a sink in block 308. For example, if a sink has a positive polarity an even number of inverters are needed. For a sink with a negative polarity and odd number of inverters are needed. The inverter level is modified by reducing the level to the largest even or odd number below the inverter level in block 308.

The inverters are placed into the buffer tree in block 312 by starting at the sink and moving toward the source. The method begins at the highest inverter level and places an inverter between the sink and an inverter of the next level. Once placed the input becomes a sink and the process is continued until the source is reached.

Figure 5:
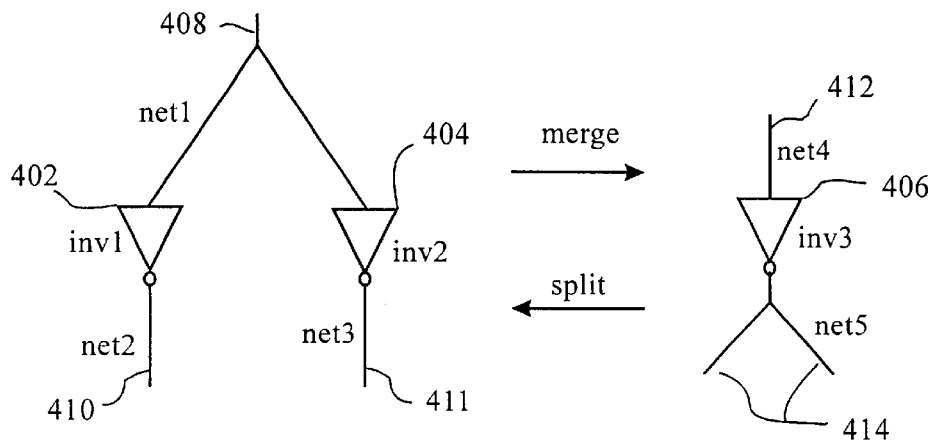
FIG. 5 is a schematic diagram showing merging and splitting of a buffer tree in accordance with the present invention.

In block 16 of FIG. 1, the buffer tree may be merged by evaluating the delay through a given path between sinks and their source and evaluating whether the inverters of the tree may be merged to simplify the buffer tree. Merging inverters of the buffer tree depends on the availability of inverter sizes in the buffer library. For example, smaller size inverters connected in parallel may be replaced by a larger inverter, however if the size of the inverter is not available in the library merging may not be possible. If a circuit has flexibility in the inverter size, for example no limitations on how large an inverter is, merging is more easily provided. The buffer tree may be split or merged as shown in FIG. 5. Inverters 402 and 404 may be merged into an inverter 406. Inverters 402 and 404 couple a net 408 to nets 410 and 411, while a net 412 is coupled to a net 414 by inverter 406. The merge is performed by making a source of net 412 the source of net 408, and a set of sinks of net 414 is the union of sets of sinks of net 410 and 411. The gains of inverters 402, 404 and 406 are the same. Splitting a buffer tree is simply the reverse procedure.

Figure 6:
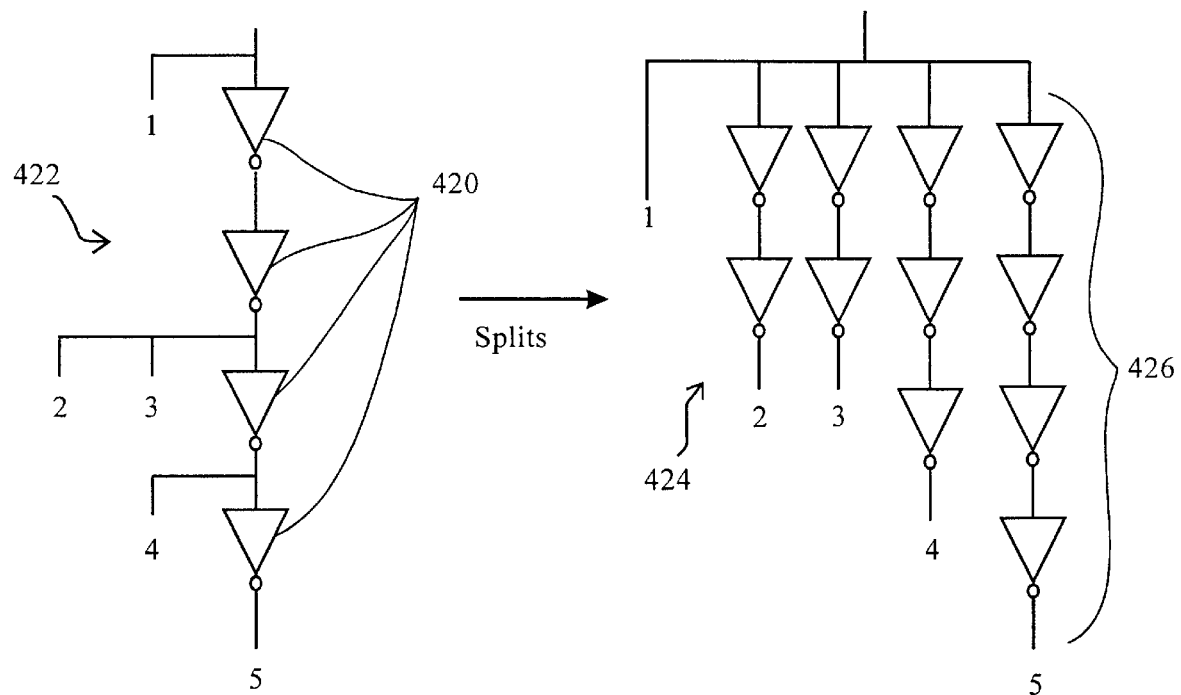
FIG. 6 is a schematic diagram showing splitting of a buffer tree in accordance with the present invention until one fanout exists for each inverter.

Referring to FIG. 6, the splitting operation may also be performed repeatedly until each inverter has only one fanout. A circuit 422 includes inverters 420 as shown in FIG. 6. Inverters 420 are split to provide a circuit 424 having inverters 426 with only one fanout each.

By performing the steps as described above, a substantial reduction in process time is achieved in accordance with the present invention relative to conventional techniques. A system for performing the steps in accordance with the method of the present invention is also shown.

Figure 7:
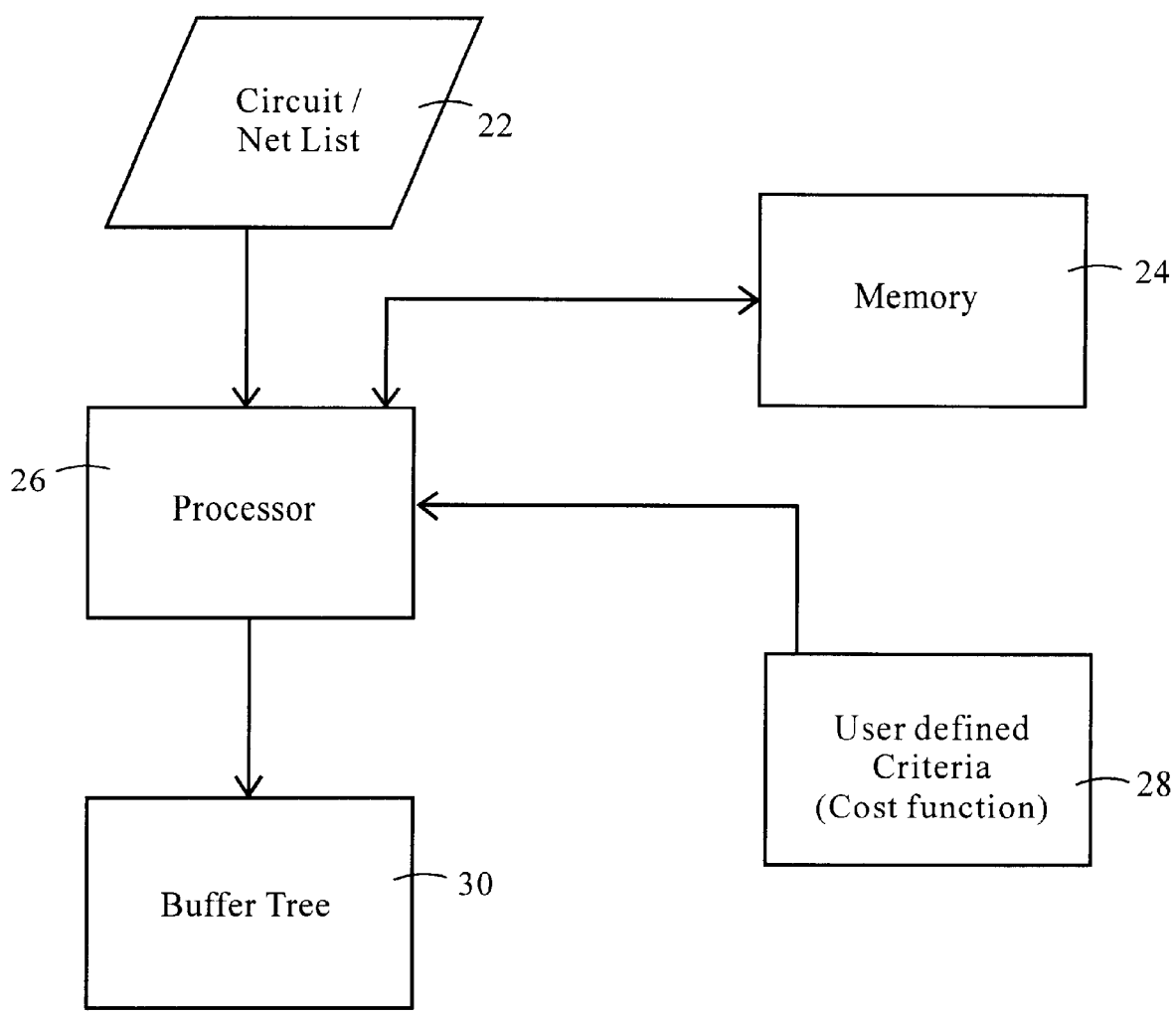
FIG. 7 is a block/flow diagram showing a system for implementing the method in accordance with the present invention.

Referring to FIG. 7, a block diagram is shown depicting elements of the system in accordance with the present invention. A net list or circuit to be analyzed is input in block 22 to a processor 26. The input describes fanout regions, each fanout region has sources, and each source is coupled to at least one sink as described above. Processor 26 determines a gain for inverters to be placed in a buffer tree. The gain is determined by a software algorithm stored in a memory 24 and executed by processor 26 which implements the method of the present invention. The gain has a same value for all inverters to be placed within the tree and is determined based on a cost function. The cost function may be a user-defined equation appropriately programmed on processor 26 and stored in memory 24. Processor 26 computes a number of inverters used to couple the source to each sink and introduces inverters into the buffer tree to couple the source to each sink. Processor 26 may be used to combine or merge inverters to simplify a buffer tree which is output from the processor. A computer program is attached in the appendix demonstrating a preferred implementation of the method in accordance with the present invention.

Having described preferred embodiments of a novel system and method for improving logic synthesis in logic circuits (which are intended to be illustrative and not limiting), it is noted that modifications and variations can be made by persons skilled in the art in light of the above teachings. It is therefore to be understood that changes may be made in the particular embodiments of the invention disclosed which are within the scope and spirit of the invention as outlined by the appended claims. Having thus described the invention with the details and particularity required by the patent laws, what is claimed and desired protected by letters patent is set forth in the appended claims:

Appendix

Input parameters include upper_gain, lower_gain and gain_delta. These parameters are preset and enable a search over a gain window to locate a buffer tree based on a cost function subprogram called cost_of buffer_tree.

```
build_buffer_tree(fanout_region)
{
                min_cost = INFINITY;
                gain = upper_gain;
                while (gain>=lower_gain) {
                        inverter_level_list = compute_level_
for_each_sink(fanout_region, gain;
                        buffer_tree = instantiate_buffer_tree
(inverter_level_list, gain);
                        cost = cost_of_buffer_tree(buffer_tree);
                        if (cost< min_cost) {
                        best_tree = buffer_tree;
                        min_cost =cost;
                        }
                        gain = gain - gain_delta;
                }
}
compute_level_for_each_sink(fanout_region, gain)
{
                inverter_delay = p + l*gain;
                for_each_sink_of_fanout_region (fanout_
region) {
                        source_to_sink_delay = arrival_
time_at_sink - arrival_time_at_source;
                        inverter_level_for_sink = truncate
(source_to_sink_delay / inverter_delay);
                        add_to_list(inverter_level_list,
inverter_level_for_sink);
                }
                        return inverter_level_list;
}
truncate(level)
{
                if (sink_has_positive_polarity) {
                        return largest_even_integer_less_than_
level;
                else {
                        return largest_odd_integer_less_than_
level;
                }
}
instantiate_buffer_tree (inverter_level_list, gain)
{
                for (i = maximum_inverter_level_among_
sinks; i>=0; i--) {
                        sinks_with_level_i = locate_sinks_with_
level (inverter_level_list, i);
                        load = sum_of_capacitive_loads
(sinks_with_level_i);
                        inverter_size = load / gain
                        inverter_from_library = locate_inverter_
size (inverter_size);
                        inverter_cell = create_cell
(inverter_from_library);
                        new_sink = input_pin(inverter_cell);
                        set_inverter_level (new_sink, i-1);
                        add_to_list (inverter_level_list,
new_sink);
                        remove_from_list (inverter_level_list,
sinks_with_level_i);
                        make_connections (output_pin
(inverter_cell), sinks_with_level_i);
                }
}
```

What is claimed is:

1. A method of fanout optimization, comprising the steps of:

inputting a net list including fanout regions, each fanout region having sources, each source being coupled to at least one sink;

determining a gain for inverters to be placed in a buffer tree, wherein the gain has a same value for all inverters to be placed within the tree, and the gain includes a ratio of a load of an inverter to an input pin capacitance of the inverter;

computing a number of inverters used to couple the source to each sink; and introducing inverters into the buffer tree to couple the source to each sink.

2. The method as recited in claim 1, further comprising the step of selecting inverters for the buffer tree from a library.

3. The method as recited in claim 1, wherein a cost function is used to select the gain based on layout area.

4. The method as recited in claim 3, wherein the gain is selected by the step of varying a value of the gain within a gain window until layout area is at a lowest value.

5. The method as recited in claim 1, further comprising the step of apportioning a delay on a path between inverters by assigning a level value for each path for representing the number of the inverters between each sink and the source of each path.

6. The method as recited in claim 5, the step of apportioning the delay includes assigning the level by taking a ratio between a delay on the path between a source and an inverter delay, and truncating a result by removing a fractional portion.

7. The method as recited in claim 6, further comprising the step of modifying the level for each path based on a polarity of the sink.

8. The method as recited in claim 1, further comprising the step of constructing the buffer tree by sizing the inverters based on a load calculated between the source and the sink for each path and dividing by the gain.

9. The method as recited in claim 1, further comprising the step of combining inverters on a path by introducing a larger inverter to replace multiple smaller inverters on the path.

10. A program storage device readable by machine, tangibly embodying a program of instructions executable by the machine to perform method steps in accordance with claim 1.

11. A method for reducing timing and capacitance violations in logic circuits, comprising the steps of:

identifying problematic fanout regions of a circuit, the fanout regions having a source coupled by a path to at least one sink;

determining a gain based on a cost function for inverters to be introduced into the circuits on each path, wherein the gain has a same value for all inverters to be placed within the circuits, and the gain includes a ratio of a load of an inverter to an input pin capacitance of the inverter;

constructing a buffer tree for each fanout region by calculating a number of inverters on the path between the source and each sink in accordance with load and timing constraints; and placing the inverters in the buffer tree starting from each sink and moving toward the source.

12. The method as recited in claim 11, further comprising the step of selecting inverters for the buffer tree from a library.

13. The method as recited in claim 11, wherein the cost function selects the gain based on layout area.

14. The method as recited in claim 13, wherein the gain is selected by the step of varying a value of the gain within a gain window until layout area is at a lowest value.

15. The method as recited in claim 11, further comprising the step of apportioning a delay on a path between inverters by assigning a level value for each path for representing the number of the inverters between each sink and the source of each path.

16. The method as recited in claim 15, further comprising the step of assigning the level by taking a ratio between a delay on the path between a source and an inverter delay, and truncating a result by removing a fractional portion.

17. The method as recited in claim 16, further comprising the step of modifying the level for each path based on a polarity of the sink.

18. The method as recited in claim 11, wherein the step of constructing the buffer tree includes the step of sizing the inverters based on a load calculated between the source and the sink for each path and dividing by the gain.

19. The method as recited in claim 11, further comprising the step of combining inverters on a path by introducing a larger inverter to replace multiple smaller inverters on the path.

20. A program storage device readable by machine, tangibly embodying a program of instructions executable by the machine to perform method steps in accordance with claim 11.

21. A system for reducing load and timing violations in logic circuits, comprising:
  means for inputting a net list including fanout regions, each fanout region having sources, each source being coupled to at least one sink;
  means for determining a gain for inverters to be placed in a buffer tree, wherein the gain has a same value for all inverters to be placed within the tree and is determined based on a cost function, the gain includes a ratio of a load of an inverter to an input pin capacitance of the inverter;
  means for computing a number of inverters used to couple the source to each sink; and
  means for introducing inverters into the buffer tree to couple the source to each sink.

22. The system as recited in claim 21, wherein the inverters for the buffer tree are selected from a library.

23. The system as recited in claim 21, wherein the inverters are single stage inverters.

* * * * *